US009581975B2

(12) United States Patent
Fujisawa

(10) Patent No.: US 9,581,975 B2
(45) Date of Patent: Feb. 28, 2017

(54) ELECTRONIC TIMEPIECE AND CONTROL METHOD OF AN ELECTRONIC TIMEPIECE

(71) Applicant: Seiko Epson Corporation, Tokyo (JP)

(72) Inventor: Teruhiko Fujisawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/060,303

(22) Filed: Mar. 3, 2016

(65) Prior Publication Data

US 2016/0259304 A1 Sep. 8, 2016

(30) Foreign Application Priority Data

Mar. 6, 2015 (JP) ................................. 2015-045222

(51) Int. Cl.

| G04R 20/02 | (2013.01) |
|---|---|
| G04R 20/04 | (2013.01) |
| G04G 19/00 | (2006.01) |
| G04C 10/04 | (2006.01) |
| G01R 31/36 | (2006.01) |
| G04R 20/06 | (2013.01) |

(52) U.S. Cl.
CPC ......... *G04R 20/02* (2013.01); *G01R 31/3606* (2013.01); *G04C 10/04* (2013.01); *G04G 19/00* (2013.01); *G04R 20/04* (2013.01); *G04R 20/06* (2013.01)

(58) Field of Classification Search
CPC ........ G04R 20/00; G04R 20/02; G04R 20/04; G04R 20/06; G04G 19/00; G04C 10/04; G01R 31/3606

See application file for complete search history.

(56) References Cited

U.S. PATENT DOCUMENTS

| 6,744,698 B2 * | 6/2004 | Koyama ................ G04G 19/08 320/132 |
|---|---|---|
| 7,983,116 B2 | 7/2011 | Fujisawa |
| 8,995,235 B2 | 3/2015 | Honda et al. |
| 2011/0235470 A1 * | 9/2011 | Fujisawa ................. G01S 19/14 368/47 |
| 2012/0176868 A1 * | 7/2012 | Matsuzaki ............. G04R 20/04 368/47 |
| 2013/0051185 A1 * | 2/2013 | Honda ................... G04G 19/08 368/47 |

FOREIGN PATENT DOCUMENTS

| JP | 2009-014668 A | 1/2009 |
|---|---|---|
| JP | 2009-168620 A | 7/2009 |
| JP | 2013-050347 A | 3/2013 |

* cited by examiner

*Primary Examiner* — Vit W Miska

(57) ABSTRACT

An electronic timepiece has a reception unit that receives satellite signals; a power supply including a battery; a remaining battery capacity detector that detects the remaining battery capacity of the power supply; an interface member; a timekeeping reception controller; and a positioning reception controller. If the user performs a positioning reception operation, the positioning reception controller does not execute a positioning reception process if the remaining battery capacity is less than a first threshold. If the timekeeping reception operation is performed, the timekeeping reception controller executes a timekeeping reception process if the remaining battery capacity is less than the first threshold.

7 Claims, 11 Drawing Sheets

ELECTRONIC TIMEPIECE AND CONTROL METHOD OF AN ELECTRONIC TIMEPIECE

BACKGROUND

1. Technical Field

The present invention relates to an electronic timepiece and a control method of an electronic timepiece that corrects the internally kept time based on signals received from GPS or other type of positioning information satellite.

2. Related Art

Electronic timepieces that are configured to receive radio signals transmitted from GPS and other types of positioning information satellites, and run the reception process if the supply voltage is greater than or equal to a specific voltage are known from the literature. See, for example, JP-A-2009-168620.

If an external interface member is manipulated to start a manual reception process, this electronic timepiece first determines if the supply voltage exceeds a specific voltage. If the supply voltage exceeds the specific voltage, the electronic timepiece receives satellite signals from plural positioning information satellites, and executes a positioning reception process that acquires time information and positioning information based on the received satellite signals. If satellite signals cannot be received from plural positioning information satellites, the internal time is corrected based on the acquired time information if satellite signals can be received and time information acquired from one positioning information satellite.

With the electronic timepiece described in claim JP-A-2009-168620, however, the specific voltage is set to a voltage enabling running the positioning reception process having a relatively long reception time of approximately one to three minutes. By thus executing the positioning reception process if the supply voltage exceeds the specific voltage, the control chip and other parts of the electronic timepiece can be prevented from shutting down as a result of the supply voltage dropping in the positioning reception process.

However, because executing the positioning reception process is conditional upon the specific voltage, if the supply voltage is less than the specific voltage, neither the positioning reception process nor the timekeeping reception process can be executed even if the supply voltage is sufficient to execute the timekeeping reception process, which concludes in a short time.

This reduces the opportunities to acquire time information and correct the internal time, and may prevent displaying the correct time.

SUMMARY

An electronic timepiece and a control method of an electronic timepiece according to the invention prevent system shutdowns due to a voltage drop during the positioning reception process and increase the opportunities to acquire time information.

An electronic timepiece according to one aspect includes: a display configured to receive satellite signals containing time information from positioning information satellites; a power supply including a battery to supply drive power; a remaining battery capacity detector configured to detect the remaining battery capacity of the power supply; an interface member; a timekeeping reception controller configured to execute a timekeeping reception process in response to a timekeeping reception operation of the interface member; and a positioning reception controller configured to execute a positioning reception process in response to a positioning reception operation of the interface member; the positioning reception controller executing the positioning reception process if the remaining battery capacity detected by the remaining battery capacity detector is greater than or equal to a first threshold, and not executing the positioning reception process if the remaining battery capacity is less than the first threshold; and the timekeeping reception controller executing the timekeeping reception process if the remaining battery capacity detected by the remaining battery capacity detector is greater than or equal to the first threshold and if the remaining battery capacity is less than the first threshold.

If the user performs the positioning reception operation, the positioning reception controller runs the positioning reception process if the remaining battery capacity detected by the remaining battery capacity detector is greater than or equal to a first threshold, and does not execute the positioning reception process if the remaining battery capacity is less than the first threshold. If the positioning reception process executes, the positioning reception controller operates the reception unit to receive satellite signals from plural positioning information satellites and calculate the location based on the received satellite signals.

The first threshold is set to a level at which the battery voltage will not drop below the minimum operating voltage of the control chip (CPU) of the electronic timepiece if the positioning reception process executes. As a result, the positioning reception process executes only if the battery voltage is greater than or equal to the first threshold, the battery voltage will remain above the minimum operating voltage of the controller of the electronic timepiece even if the battery voltage drops in the positioning reception process, and a system shutdown occurring if the positioning reception process executes can be reliably prevented.

Furthermore, because restricting the reception process based on the battery voltage is limited to the positioning reception process, the timekeeping reception process can still run even if the battery voltage is less than the first threshold. The timekeeping reception process can therefore execute even if the battery voltage is less than the first threshold, opportunities to acquire time information can be increased, and the accuracy of the time displayed on the electronic timepiece can be improved.

In an electronic timepiece according to another aspect, the timekeeping reception controller executes the timekeeping reception process if the remaining battery capacity detected by the remaining battery capacity detector is greater than or equal to a second threshold that is lower than the first threshold, and does not execute the timekeeping reception process if the remaining battery capacity is less than the second threshold.

If the user performs the timekeeping reception operation, the timekeeping reception controller runs the timekeeping reception process if the remaining battery capacity detected by the remaining battery capacity detector is greater than or equal to a second threshold, and does not execute the timekeeping reception process if the remaining battery capacity is less than the second threshold. If the timekeeping reception process executes, the timekeeping reception controller operates the reception unit to receive satellite signals from at least one positioning information satellite and acquire time information from the received satellite signals.

The second threshold is set to a level at which the battery voltage will not drop below the minimum operating voltage of the control chip (CPU) of the electronic timepiece if the timekeeping reception process executes. As a result, the timekeeping reception process can execute only if the battery voltage is greater than or equal to the second threshold, the battery voltage will remain above the minimum operating voltage of the controller of the electronic timepiece even if the battery voltage drops in the timekeeping reception process, and a system shutdown occurring if the timekeeping reception process executes can be reliably prevented.

Note that because the timekeeping reception process only needs to be able to acquire time information, only one positioning information satellites needs to be locked onto, the average reception time is approximately ten-plus seconds, and energy consumption can be reduced to approximately 1/5 the energy consumption in the positioning reception process. Chances to run the reception process can therefore be easily assured and opportunities to acquire time information can be increased even if the second threshold is set lower than the first threshold and the timekeeping reception process executes only if the battery voltage meets the second threshold.

An electronic timepiece according to another aspect preferably also has a remaining battery capacity display configured to display the remaining battery capacity detected by the remaining battery capacity detector at least if the positioning reception controller starts the positioning reception process.

Because the remaining battery capacity detected by the remaining battery capacity detector is displayed by the remaining battery capacity display, the remaining battery capacity can be displayed for the user if the user performs the positioning reception operation. As a result, if the positioning reception process does not execute if the positioning reception operation is performed because the remaining battery capacity is less than the first threshold, the user can know that the reception process did not run because the battery power is low. The user can therefore know that the reason the positioning reception process did not execute is not because there is a timepiece malfunction, and the user's ease of mind can be improved.

Note that the remaining battery capacity display may also display the remaining battery capacity if the timekeeping reception controller starts the timekeeping reception process. The user can thus be informed that the reason the reception process did not run is because of low battery power.

An electronic timepiece according to another aspect preferably also has: a reception state display configured to indicate the positioning reception process if the positioning reception process is executing, and indicate the timekeeping reception process if the timekeeping reception process is executing.

Because the reception state display in this aspect displays that the positioning reception process is executing or the timekeeping reception process is executing, the user can easily know if the current reception process is in the positioning mode or the timekeeping mode.

Further preferably in an electronic timepiece according to another aspect, the power supply includes a power generator and a storage battery that is charged by power produced by the power generator.

The power generator may be a solar cell or a generator driven by a rotary pendulum, or any other generator that may be used in a timepiece.

Thus comprised, if the remaining battery capacity drops below the first threshold or the second threshold, but the storage battery is then charged by the generator and the remaining battery capacity exceeds the first threshold or the second threshold, the appropriate reception process can be executed by the user performing the positioning reception operation or the timekeeping reception operation again.

In an electronic timepiece according to another aspect, the timekeeping reception controller starts the timekeeping reception process if the interface member is operated continuously for a first set time; the timekeeping reception controller continues the timekeeping reception process if operation of the interface member is released before a second set time that is longer than the first set time passes; and operation switches from the timekeeping reception process of the timekeeping reception controller to the positioning reception process of the positioning reception controller if the interface member is operated continuously for the second set time.

Thus comprised, the timekeeping reception process starts if the user operates a pushbutton or other interface member for a first set time (such as 3 seconds) or longer, changes operation from the timekeeping reception process to the positioning reception process if operation of the interface member then continues until a second set time (such as 6 seconds) passes, and continues operation in the timekeeping reception process if the interface member is released before the second set time is reached.

Thus comprised, the timekeeping reception operation is confirmed if the interface member is operated continuously for at least 3 seconds but is then released before 6 seconds passes, the timekeeping reception process can start sooner than if the timekeeping reception process starts after the timekeeping reception operation is confirmed after waiting 6 seconds, and the time from if the user starts the operation, satellite signals are received, and time information is acquired can be shortened.

Another aspect is a control method of an electronic timepiece including a display configured to receive satellite signals containing time information from positioning information satellites; a power supply including a battery to supply drive power; a remaining battery capacity detector configured to detect the remaining battery capacity of the power supply; an interface member; a timekeeping reception controller configured to execute a timekeeping reception process in response to a timekeeping reception operation of the interface member; and a positioning reception controller configured to execute a positioning reception process in response to a positioning reception operation of the interface member. The control method includes: the positioning reception controller executing the positioning reception process if the remaining battery capacity detected by the remaining battery capacity detector is greater than or equal to a first threshold, and not executing the positioning reception process if the remaining battery capacity is less than the first threshold; and the timekeeping reception controller executing the timekeeping reception process if the remaining battery capacity detected by the remaining battery capacity detector is greater than or equal to the first threshold and if the remaining battery capacity is less than the first threshold.

The control method of an electronic timepiece according to this aspect has the same operational effect as the electronic timepiece described herein.

Other objects and attainments together with a fuller understanding of the invention will become apparent and appreciated by referring to the following description and claims taken in conjunction with the accompanying drawings.

DESCRIPTION OF EMBODIMENTS

Preferred embodiments are described below with reference to the accompanying figures. Note that the crystal 15 side of the electronic timepiece 1 according to this embodiment is also referred to as the face, front, or top side, and the back cover 12 side is also referred to as the back or bottom side of the electronic timepiece 1.

Figure 1:
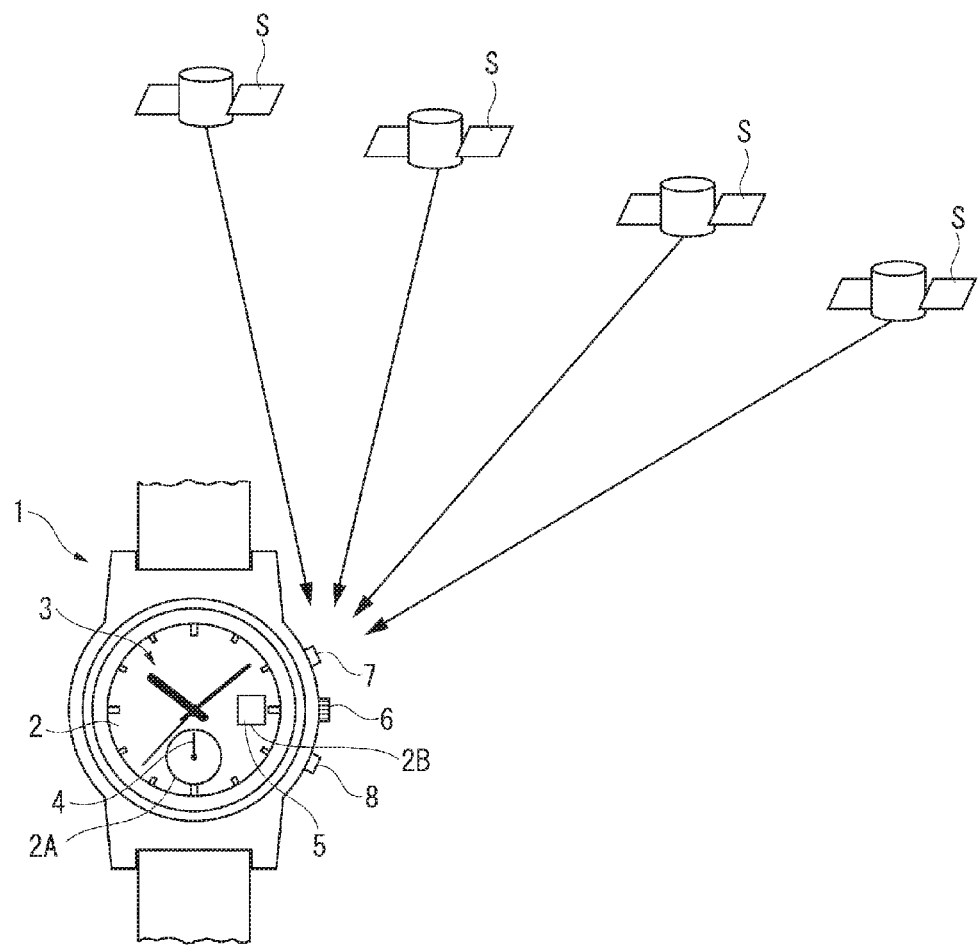
FIG. 1 illustrates an electronic timepiece.
Figure 2:
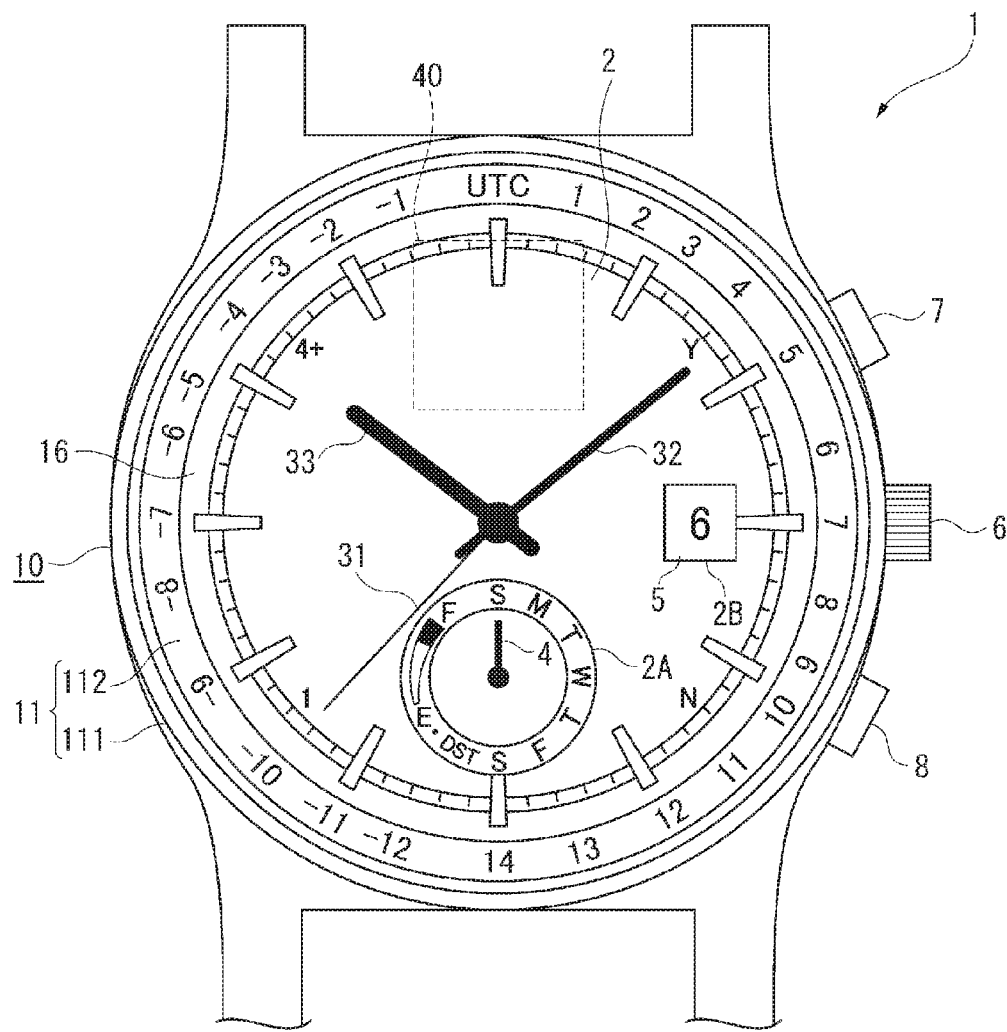
FIG. 2 is a plan view of the electronic timepiece.

As shown in FIG. 1 and FIG. 2, the electronic timepiece 1 is a wristwatch with a time display for displaying the time using a dial 2 and hands 3, an information display including a subdial 2A of the dial 2 and a hand 4, and a calendar display including a window 2B in the dial 2 and a date wheel 5.

The dial 2 is a disc-shaped member made of polycarbonate or other non-conductive material. The dial 2 has a scale for displaying the time. A Y marker denoting successful reception is provided at the 8-second position on the dial 2; a N marker denoting reception failed is provided at the 22-second position on the dial 2; a 1 marker indicating reception in the timekeeping mode is provided at the 38-second position on the dial 2; and a 4+ marker indicating reception in the positioning mode is provided at the 52-second position.

The subdial 2A is located at 6:00 on the dial 2. On the right half of the subdial 2A are the letter markers S, M, T, W, T, F, S denoting the days of the week. At 8:00 on the left side of the subdial 2A (the position of 8:00 relative to the pivot 4A of the hand 4) is a DST marker indicating daylight saving time is set, and a black dot (.) indicating DST is not set. E and F markers on opposite ends of a sickle shaped marker for indicating the remaining battery capacity (power reserve) are provided on the left half of the subdial 2A. The information display comprising the subdial 2A and hand (small hand) 4 is used to display the operating mode of the timepiece, the day of the week, and the remaining battery capacity.

Figure 3:
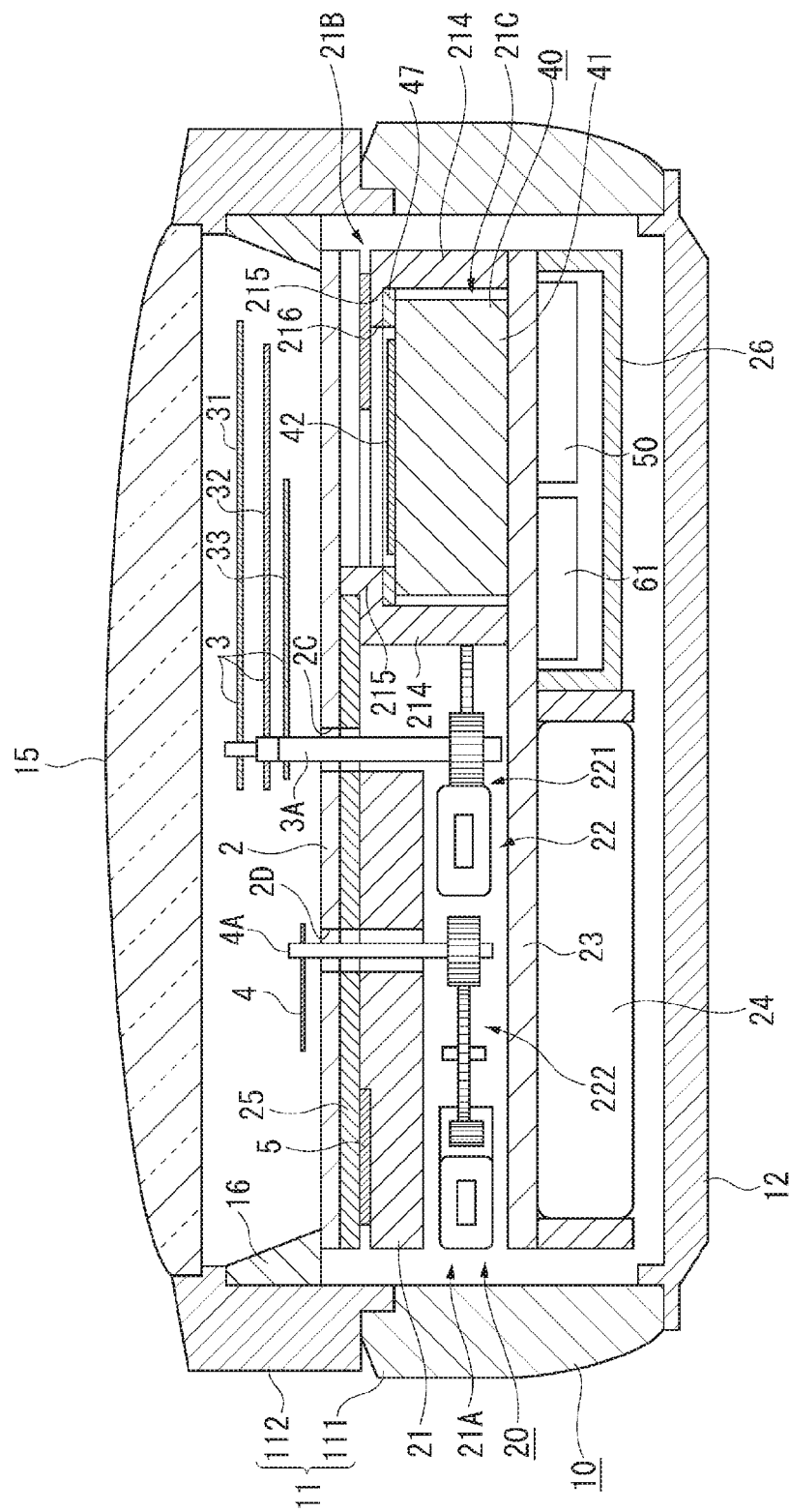
FIG. 3 is a section view of the electronic timepiece.

A date window 2B is provided at 3:00 on the dial 2. In addition to the window 2B as shown in FIG. 3, the dial 2 has a through-hole 2C through which the center pivot 3A of the hands 3 passes, and a through-hole 2D through which the pivot 4A of the small hand 4 passes.

The hands 3 include a second hand 31, minute hand 32, and hour hand 33. The hands 3, 4 and date wheel 5 are driven by a drive mechanism including a stepper motor and wheel train described further below.

The electronic timepiece 1 also has a crown 6 and buttons 7 and 8 as external interface members.

The electronic timepiece 1 is configured to receive satellite signals and acquires satellite time information from the plural GPS satellites S orbiting the Earth on known orbits, and correct internal time information based on the acquired satellite time information.

Note that the GPS satellites S shown in FIG. 1 are just one example of positioning information satellites, and numerous GPS satellites S are in orbit. There are presently approximately 30 GPS satellites S in service.

External Structure of the Electronic Timepiece

As shown in FIG. 2 and FIG. 3, the electronic timepiece 1 has a case 10 that houses a movement 20 described further below. The case 10 includes the main case 11, and the back cover 12.

The main case 11 includes a tubular outside case member 111, and a bezel 112 disposed on the front side of the outside case member 111.

The bezel 112 is shaped like a ring with the outside of the bezel 112 continuous to the outside of the outside case member 111. The bezel 112 and outside case member 111 are connected by an interlocking tongue-and-groove structure formed on their mutual opposing surfaces, or by adhesive or double-sided adhesive tape, for example. The bezel 112 may also be attached so that it can rotate on the outside case member 111.

The crystal 15 is attached to the inside of the bezel 112 as a cover member held by the bezel 112.

A round back cover 12 is disposed to the back cover side of the outside case member 111 covering the back cover side opening to the outside case member 111. The back cover 12 and the outside case member 111 screw together.

Note that the outside case member 111 and the back cover 12 are discrete members in this embodiment, but the invention is not so limited and the outside case member 111 and back cover 12 may be formed as a single piece.

The outside case member 111, bezel 112, and back cover 12 are made of brass, stainless steel, titanium alloy, or other conductive metal material.

Internal Configuration of the Electronic Timepiece

The internal structure housed in the case 10 of the electronic timepiece 1 is described next.

As shown in FIG. 2 and FIG. 3, a movement 20, planar antenna 40 (patch antenna), date wheel 5, and dial ring 16 are housed in addition to the dial 2 inside the case 10.

The movement 20 includes the base plate 21, a drive module 22 supported by the base plate 21, a circuit board 23, a storage battery 24, and a solar panel 25.

The base plate 21 is made from plastic or other non-conductive material. The base plate 21 includes a drive module housing 21A that holds the drive module 22, a date wheel housing 21B where the date wheel 5 is disposed, and an antenna housing 21C that holds the planar antenna 40.

The drive module housing 21A and antenna housing 21C are disposed on the back side of the base plate 21. The antenna housing 21C has four walls 214 (only two shown in FIG. 3) around the four sides of the planar antenna 40, and four cover parts 215 (only two shown in FIG. 3) protruding from the walls 214 and opposing the front side of the planar antenna 40. A through-hole 216 overlapping at least part of the antenna electrode 42 of the planar antenna 40 in plan view is formed between the cover parts 215. Note that the four walls 214 are formed in unison, and the four cover parts 215 are formed in unison.

Because the antenna housing 21C is at 12:00 on the dial 2 in plan view, the planar antenna 40 is also located at 12:00 as shown in FIG. 2.

The drive module 22 is held in the drive module housing 21A of the base plate 21, and drives the time display, information display, and date display. More specifically, the drive module 22 includes a drive mechanism 221 with a stepper motor and wheel train for driving the hands 3, a drive mechanism 222 with a stepper motor and wheel train for driving the hand 4, and a drive mechanism including a stepper motor and wheel train for driving the date wheel 5 (not shown in the figure).

The top side of the circuit board 23 contacts the back side of the base plate 21, and is attached to the base plate 21 by screw or other fastener. The planar antenna 40 is mounted on the face side of the circuit board 23. A reception module 50 (wireless communication unit) that processes satellite signals received by the planar antenna 40 from the GPS satellites S, and a controller 61 that controls the drive mechanisms 221 and 222, are mounted on the back side of the circuit board 23. The planar antenna 40 and the reception module 50 thus are an example of the reception unit configured to receive satellite signals from GPS satellites S or other positioning information satellites.

The reception module 50 and controller 61 are located on the opposite side of the circuit board 23 as the planar antenna 40. The reception module 50 and controller 61 are also enclosed in a shield 26. As a result, signals received by the planar antenna 40 are protected from noise produced by the reception module 50 and controller 61.

A lithium ion battery is used for the storage battery 24. The storage battery 24 supplies power to the drive module 22, reception module 50, and controller 61. The storage battery 24 is also disposed to the back side of the circuit board 23 at a position not overlapping the reception module 50 and controller 61 in plan view.

The surface electrode of the solar panel 25 is made from indium tin oxide (ITO) or other transparent electrode material that passes light. An amorphous silicon semiconductor thin film is formed as the photovoltaic layer on a plastic film base layer.

Because GPS satellite signals are high frequency signals transmitted at approximately 1.5 GHz, GPS signals are attenuated by even the thin transparent electrode of the solar panel, unlike the long wave standard time signals that are received by radio-controlled timepieces, and antenna performance drops. As a result, a notch is formed in the disc-shaped solar panel 25 at the position overlapping the planar antenna 40 in plan view. The solar panel 25 therefore covers the face side of the base plate 21 but does not cover the planar antenna 40. The planar antenna 40 can therefore receive radio waves through the notch in the solar panel 25.

Note that an opening superimposed in plan view with the window 2B in the dial 2, and holes through which the center pivot 3A of the hands 3 and the pivot 4A of the small hand 4 pass are also formed in the solar panel 25.

The planar antenna 40, which is a patch antenna (microstrip antenna), is disposed in the antenna housing 21C. The planar antenna 40 receives satellite signals from GPS satellites S. The planar antenna 40 is described further below in detail.

The date wheel 5, which is a ring-shaped calendar wheel having date numbers displayed on the surface, is held in the date wheel housing 21B of the base plate 21. The date wheel 5 is made from plastic or other non-conductive material. In plan view, the date wheel 5 overlaps at least part of the planar antenna 40. Note that the calendar wheel is not limited to a date wheel 5, and may be a day wheel showing the days of the week, or a month wheel showing the months.

The dial 2 is disposed to the face side of the base plate 21 covering the solar panel 25 and the date wheel 5. The dial 2 is made from a material such as plastic that is non-conductive and passes at least some light.

Abbreviations or other markings can be disposed to the surface of the dial 2 overlapping the planar antenna 40 in plan view. To improve the reception performance of the planar antenna 40 in this event, these parts are preferably made from plastic or other non-conductive material instead of metal.

Because the dial 2 is transparent to light, the solar panel 25 located on the back side of the dial 2 can be seen through the dial 2 from the front of the timepiece. The color of the dial 2 therefore appears different in the areas where the solar panel 25 is present and where the solar panel 25 is not present. Design accents may be added to the dial 2 so that this color different is not conspicuous.

By forming the notch in the solar panel 25, the color tone of the dial 2 in the part overlapping the notch may appear different from the tone in other parts of the dial 2. To prevent this, a plastic sheet of the same color (such as dark blue or purple) as the solar panel 25 may be disposed below the solar panel 25, or the signal-blocking electrode layer may be omitted only in the part overlapping the planar antenna 40 in plan view instead of cutting completely through the solar panel 25 so that the plastic film base layer remains and the color of the solar panel 25 is the same throughout.

A dial ring 16 is made of a plastic non-conductive material in a ring shape, and is disposed on the face side of the dial 2. The dial ring 16 is disposed around the circumference of the dial 2, is conically shaped with the inside circumference surface sloping down to the dial 2, and has 60 minute markers printed on the inside sloping surface. The dial ring 16 is held pressed against the dial 2 by the bezel 112.

In plan view, the planar antenna 40 does not overlap the main case 11 (outside case member 111 and bezel 112) and solar panel 25, but does overlap the date wheel 5, dial 2, and crystal 15, which are made from non-conductive materials. More specifically, all parts of the electronic timepiece 1 that are over the face side of the planar antenna 40 in plan view are made from non-conductive materials.

As a result, satellite signals passing from the face side of the timepiece pass through the crystal 15, pass through the dial 2, date wheel 5, and base plate 21 without interference from the main case 11 or solar panel 25, and are incident to the planar antenna 40. Note that because the hands 3, 4 overlap only a small area of the planar antenna 40, there is no interference with signal reception even if the hands are metal, but the hands are preferably made from a non-conductive material because any interference with signal reception can be avoided.

Planar Antenna

GPS satellites S transmit right-hand circularly polarized satellite signals. As a result, the planar antenna 40 according to this embodiment is a patch antenna (also called a microstrip antenna) with excellent circular polarization characteristics.

The planar antenna 40 according to this embodiment is a patch antenna having a conductive antenna electrode 42 on a ceramic dielectric substrate 41.

This planar antenna 40 is manufactured as described below. First, barium titanate with a dielectric constant of 60-100 is formed to the desired shape in a press and sintered to complete the ceramic dielectric substrate 41 of the antenna. A ground electrode (not shown in the figure) forming the ground plane (GND) of the antenna is made by screen printing a primarily silver (Ag) paste, for example, on the back side (the side facing the circuit board 23) of the dielectric substrate 41.

A radiating antenna electrode 42 that determines the antenna frequency and the polarity of the received signals is formed on the face side of the dielectric substrate 41 (the side facing the base plate 21 and dial 2) by the same method as the ground electrode. The antenna electrode 42 is slightly smaller than the surface area of the dielectric substrate 41, and an exposed surface 411 where the antenna electrode 42 is not present is disposed around the antenna electrode 42 on the surface of the dielectric substrate 41.

A square patch antenna resonates if one side is a half wavelength, and a round patch antenna resonates if the diameter is approximately 0.58 wavelength, but the size of the antenna size can be reduced by the wavelength shortening effect of a dielectric. A patch antenna works by the strong electric field around the edge of the patch (antenna electrode 42) radiating from the edge into space, and the electric lines of force become stronger with proximity to the antenna and are easily affected by the effects of nearby metals and dielectrics. To receive GPS satellite signals, therefore, the distance between the metal outside case member 111 and the antenna electrode 42 must be at least 3 mm, and is ideally approximately 4 mm.

In this example, the walls 214 are located between the planar antenna 40 and outside case member 111, and the planar antenna 40 is disposed to a position separated at least a specific distance from the inside surface of the outside case member 111. As a result, a drop in reception performance due to the proximity of the planar antenna 40 to the metal outside case member 111 can be suppressed, and the reception performance required by the electronic timepiece 1 can be assured.

The planar antenna 40 is mounted on the circuit board 23, and is electrically connected to the GPS antenna module, which is the reception module 50 on the back side of the circuit board 23. The circuit board 23 can also function as a ground plane by connecting the ground electrode of the planar antenna 40 through the ground pattern of the circuit board 23 to the ground node of the reception module 50. The outside case member 111 and back cover 12 can also be used as the ground plane by connecting the ground node of the reception module 50 through the ground pattern of the circuit board 23 to the metal outside case member 111 or back cover 12.

The planar antenna 40 is held in the antenna housing 21C by of the circuit board 23 to the base plate 21. Because the planar antenna 40 receives high frequency signals at 1.54542 GHz, and includes a ceramic dielectric substrate 41 with a high dielectric constant, the planar antenna 40 is susceptible to the effects of surrounding parts. The base plate 21 is plastic, but has a dielectric constant of 3-4, and affects the reception frequency if the gap between the base plate 21 and the antenna electrode 42 is less than approximately 1.0 mm. More specifically, the antenna frequency may shift and reception performance drop if the gap between the base plate 21 and the antenna electrode 42 varies even slightly.

As shown in FIG. 3, a through-hole 216 is formed in the antenna housing 21C of the base plate 21 in the surface opposite the antenna electrode 42 of the planar antenna 40, that is, the surface on the dial 2 side.

The through-hole 216 in this example is formed overlapping all of the antenna electrode 42 in plan view. More specifically, because the antenna electrode 42 is substantially rectangular in plan view, the through-hole 216 is also rectangular in plan view when seen from the dial side of the electronic timepiece 1.

The length of one side of the rectangular through-hole 216 is greater than the length of one side of the antenna electrode 42 and less than the length of one side of the dielectric substrate 41. Note that in this example the length of each of the four sides of the through-hole 216 is the same, but the through-hole 216 may be formed as a rectangle with different length and width dimensions in plan view.

By thus providing a through-hole 216 superimposed on the antenna electrode 42 in plan view, the base plate 21 (dielectric) does not cover and is not closer than 1.0 mm to the antenna electrode 42, and the antenna frequency is prevented from shifting due to variation in the gap between the antenna electrode 42 and the dielectric base plate 21.

The length between the walls 214 is set to a dimension that accommodates the dielectric substrate 41 of the planar antenna 40. The cover parts 215 protruding from the walls 214 are formed overlapping the exposed surface 411 of the dielectric substrate 41 in plan view.

A sponge or other type of shock absorber 47 is also disposed between the exposed surface and the cover parts 215. The position of the planar antenna 40 in the thickness direction of the timepiece is set by holding the dielectric substrate 41 against the shock absorber 47.

The ceramic dielectric substrate 41 is also hard and easily chipped, but the dielectric substrate 41 can be prevented from striking the base plate 21 by the intervening shock absorber 47. Damage resulting from the dielectric substrate 41 hitting the base plate 21 can therefore also be prevented.

Part of the date wheel 5 is also disposed on the dial 2 side of the planar antenna 40. Because the antenna electrode 42 and date wheel 5 are separated by at least the thickness of the cover parts 215, the date wheel 5 is prevented from causing the antenna frequency to shift.

Circuit Configuration of the Electronic Timepiece

The circuit design of the electronic timepiece 1 is described next with reference to FIG. 4.

Figure 4:
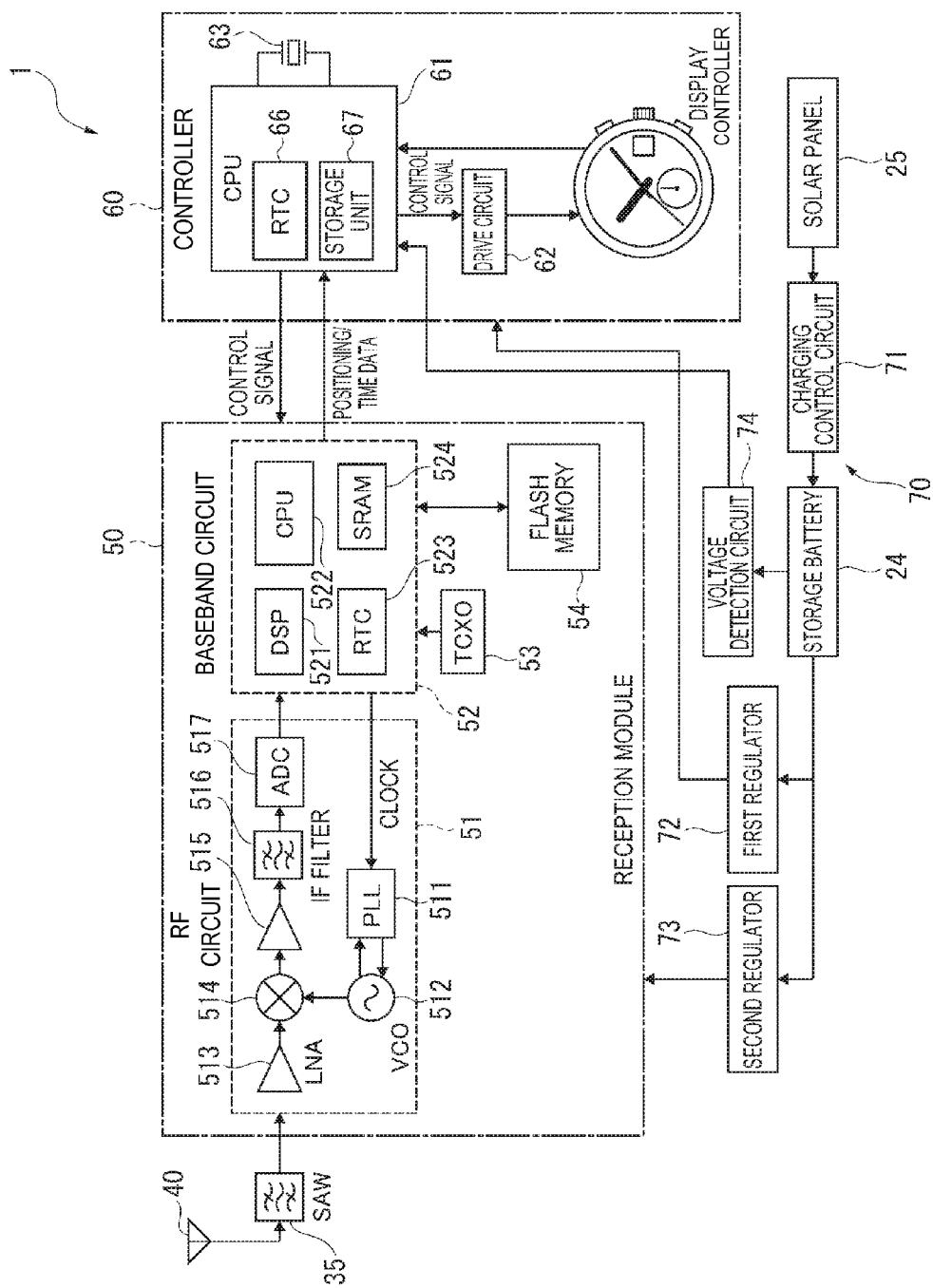
FIG. 4 is a block diagram illustrating the circuit design of the electronic timepiece.

As shown in FIG. 4, the electronic timepiece 1 has a planar antenna 40, a SAW filter 35, the reception module 50, a display controller 60, and a power supply 70.

The SAW filter 35 is a bandpass filter that passes signals in the 1.5 GHz waveband. A LNA (low noise amplifier) may also be disposed between the planar antenna 40 and the SAW filter 35 to improve reception sensitivity.

Note also that the SAW filter 35 may be embedded in the reception module 50.

The reception module 50 processes satellite signals passed through the SAW filter 35, and includes an RF (radio frequency) unit 51 and a baseband circuit 52.

The RF circuit 51 includes a PLL (phase-locked loop) circuit 511, a VCO (voltage controlled oscillator) 512, a LNA (low noise amplifier) 513, a mixer 514, an IF (intermediate frequency) amplifier 515, an IF filter 516, and an A/D converter 517.

The satellite signal passed by the SAW filter 35 is amplified by the LNA 513, mixed by the mixer 514 with the clock signal output by the VCO 512, and down-converted to a signal in the intermediate frequency band.

The IF signal from the mixer 514 is amplified by the IF amplifier 515, passed through the IF filter 516, and converted to a digital signal by the A/D converter 517.

The baseband circuit 52 includes, for example, a DSP (digital signal processor) 521, CPU (central processor) 522, a RTC (real-time clock) 523, and SRAM (static random access memory) 524. A TCXO (temperature compensated crystal oscillator) 53 and flash memory 54 are also connected to the baseband circuit 52.

A digital signal is input from the A/D converter 517 of the RF circuit 51 to the baseband circuit 52, which acquires satellite time information and navigation information by a correlation process and positioning computing process.

Note that the clock signal for the PLL circuit 511 is generated by the TCXO 53.

A time difference (time zone) database relating positioning information (latitude and longitude) to time difference (time zone) information is stored in flash memory 54. Note that an EEPROM (electrically erasable programmable read-only memory) device may be used instead of flash memory 54.

Note that while the time zone database is stored in the flash memory 54 of the reception module 50 in this embodiment, nonvolatile memory such as EEPROM or flash memory may be provided in the controller 61 of the display controller 60, and the time difference database stored in this nonvolatile memory device.

The display controller 60 includes a controller (CPU) 61, a drive circuit 62 that drives the hands 3, 4, a crystal oscillator 63, a time display, and an information display.

The controller 61 includes a RTC 66 and storage unit 67.

The RTC 66 calculates the internal time information using a reference signal output from a crystal oscillator 63.

The storage unit 67 stores the satellite time information and positioning information output from the reception module 50.

By having the reception module 50 and display controller 60 described above, the electronic timepiece 1 in this example can also automatically correct the displayed time based on the satellite signals received from the GPS satellites S.

The power supply 70 includes the solar panel 25, a charging control circuit 71, the storage battery 24, a first regulator 72, a second regulator 73, and a voltage detection circuit 74.

When light is incident and the solar panel 25 produces power, the power obtained by photovoltaic generation is passed by the charging control circuit 71 to the storage battery 24 to charge the storage battery 24. The solar panel 25 therefore is an example of the power generator.

The storage battery 24 supplies drive power through the first regulator 72 to the display controller 60, and supplies power through the second regulator 73 to the reception module 50. The storage battery 24 therefore is an example of a power supply that supplies drive power.

The voltage detection circuit 74 monitors the output voltage of the storage battery 24, and outputs to the controller 61. The voltage detection circuit 74 therefore is an example of a reserve power detector that detects how much power remains in the storage battery 24. Because the battery voltage detected by the voltage detection circuit 74 is input to the controller 61, the controller 61 can know the storage battery 24 voltage and control the reception process appropriately.

Navigation Message (GPS Satellite)

The navigation data message contained in the satellite signals sent from a GPS satellite and carrying the acquired information described above is described next. Note that the navigation message is modulated at 50 bps onto the satellite signal carrier.

Figure 5A:
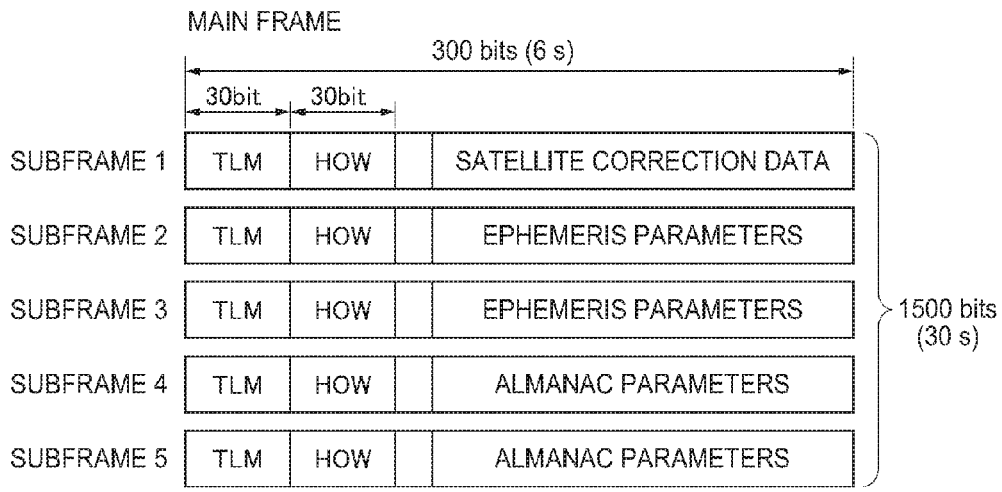
FIGS. 5A, 5B and 5C describe the format of a GPS satellite signal.
Figure 5B:
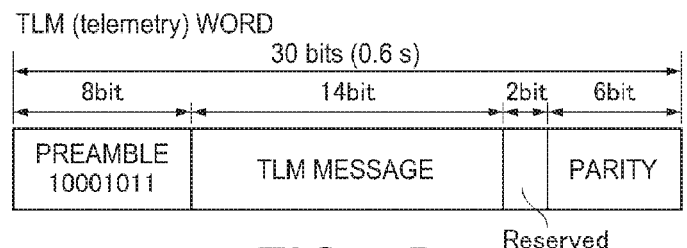
Figure 5C:
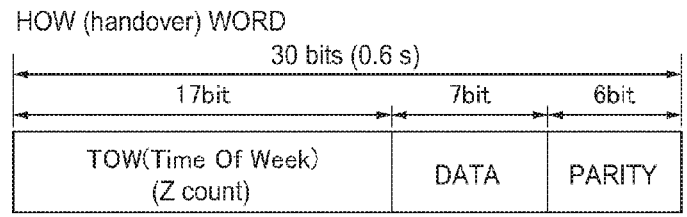

FIG. 5A to FIG. 5C describe the format of the navigation message.

As shown in FIG. 5A, a navigation message is composed of main frames each containing 1500 bits. Each main frame is divided into five subframes 1 to 5 of 300 bits each. The data in one subframe is transmitted in 6 seconds from each GPS satellite. It therefore takes 30 seconds for the data in one main frame to be transmitted from a GPS satellite.

Subframe 1 contains satellite correction data including week number data and SV health information. The week number identifies the week of the current GPS time information. More specifically, GPS time started at 00:00:00 on Jan. 6, 1980 in UTC, and the week number of the week that started that day is week number 0. The week number is updated every week. The SV health information is a code indicating satellite errors, and this code can be used to prevent using signals transmitted from satellites where there is an error.

Because subframes 1 to 3 in each set of five subframes contains information specific to a particular satellite, the same content is repeated during every transmission. More specifically, subframes 1 to 3 contain clock correction data and orbit information (ephemeris) specific to the transmitting satellite. Subframes 4 and 5, however, contain orbit information for all satellites (almanac data) and ionospheric correction information, which because of the large amount of information is divided into page units and stored in subframes 4 and 5 over pages 1 to 25. Because 25 frames are required to transmit the content of all pages, 12 minutes 30 seconds is required to receive all of the information in the navigation message.

Each of subframes 1 to 5 starts with a telemetry (TLM) word storing 30 bits of telemetry data followed by a HOW word (handover word) storing 30 bits of handover data.

Therefore, while the TLM and HOW words are transmitted at 6-second intervals from the GPS satellites, the week number data and other satellite correction data, ephemeris, and almanac data are transmitted at 30-second intervals.

As shown in FIG. 5B, the TLM word contains a preamble, a TLM message and reserved bits, and parity data.

As shown in FIG. 5C, the HOW word contains GPS time information called the TOW or Time of Week (also called the Z count). The Z count denotes in seconds the time passed since 00:00 of Sunday each week, and is reset to 0 at 00:00 Sunday the next week. More specifically, the Z count denotes the time passed from the beginning of each week in seconds. The Z count denotes the GPS time at which the first bit of the next subframe data is transmitted.

For example, the Z count transmitted in subframe 1 denotes the GPS time that the first bit in subframe 2 is transmitted. The HOW word also contains 3 bits of data denoting the subframe ID (ID code). More specifically, the HOW words of subframes 1 to 5 shown in FIG. 5A contain the ID codes 001, 010, 011, 100, and 101, respectively.

Controller Configuration

Figure 6:
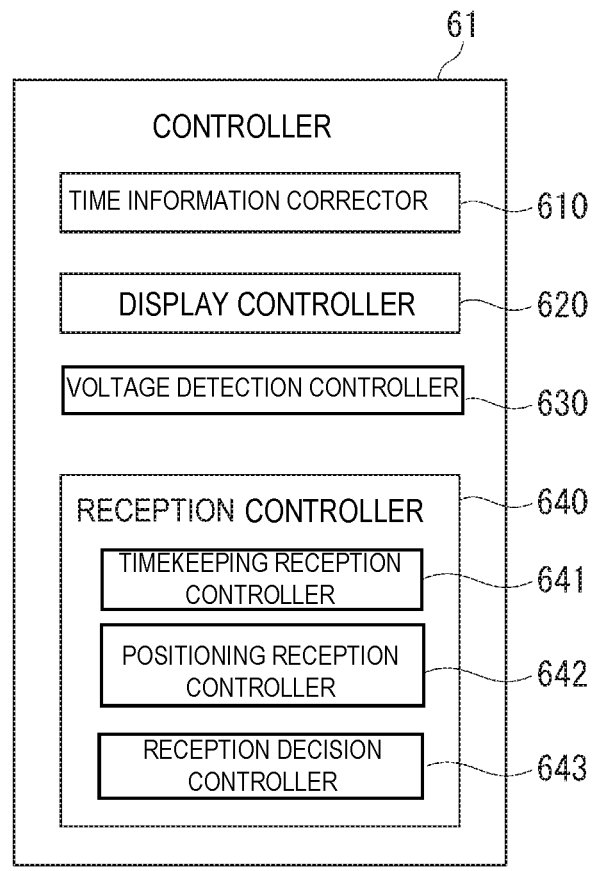
FIG. 6 is a block diagram illustrating the configuration of the controller of the electronic timepiece

The configuration of the controller 61 is described next with reference to FIG. 6. FIG. 6 illustrates the function blocks that are embodied by primarily the controller 61 executing programs.

The controller 61 includes a time information corrector 610, display controller 620, voltage detection controller 630, and a reception controller 640.

The time information corrector 610 corrects the internal time information using the time information received by the reception module 50.

In the normal operating mode, the display controller 620 controls the drive circuit 62 based on the internal time information to display the time (hour, minute, second) with the hands 3. The display controller 620 also controls the drive circuit 62 based on the internal time information to indicate the day of the week (Sunday to Saturday) with the subdial hand 4.

The display controller 620 controls the information indicated by the hands 3, 4 appropriately to the reception control state. The control method is described more specifically below.

The voltage detection controller 630 operates the voltage detection circuit 74 to detect the storage battery 24 voltage, that is, the remaining battery capacity. The voltage detection controller 630 operates the voltage detection circuit 74 and detects the battery voltage at a specific time interval.

The reception controller 640 includes a timekeeping reception controller 641, a positioning reception controller 642, and a reception decision 643.

When button 7, which is an interface member, is pushed for a first set time (3 seconds in this example), the timekeeping reception controller 641 determines the timekeeping reception operation was performed, and controls the reception module 50 to execute the timekeeping reception process.

When button 7, which is an interface member, is pushed for a second set time (6 seconds in this example), the positioning reception controller 642 determines the positioning reception operation was performed, and controls the reception module 50 to execute the positioning reception process.

The reception decision 643 determines if the timekeeping reception process of the timekeeping reception controller 641 or the positioning reception process of the positioning reception controller 642 was successful. For example, in the timekeeping reception process, the reception decision 643 may determine if the time information (Z count) acquired from the received satellite signal and the timekeeping data of the RTC 66 match. If the difference therebetween is too great, the reception decision 643 may compare the Z count from the next subframe received 6 seconds later with the timekeeping data of the RTC 66 to to check for correction errors. If multiple satellites are locked onto, the reception decision 643 may compare the Z counts from the plural satellites to determine if the time data matches. If the reception decision 643 determines the times match, the time information corrector 610 corrects the time.

Manual Reception Process

The processes executed as a result of pushing the button 7 in specific operations for displaying the reception result, starting reception in the timekeeping mode, and starting reception in the positioning mode are described next with reference to FIG. 7 and FIG. 8.

The controller 61 first determines if the button 7 was pressed (S1).

If the button 7 was pushed and S1 returns YES, the controller 61 drives the display controller 620 and the display controller 620 then moves hand 4, which indicates the day of the week in the normal mode, so that the hand 4 indicates the voltage of the storage battery 24, which represents the remaining capacity of the storage battery 24 (reserve power). The display controller 620 also moves the second hand 31, which in the normal mode indicates the second of the time, so that the second hand 31 indicates the result of the last reception process (so the second hand 31 points to Y or N as appropriate).

Figure 8:
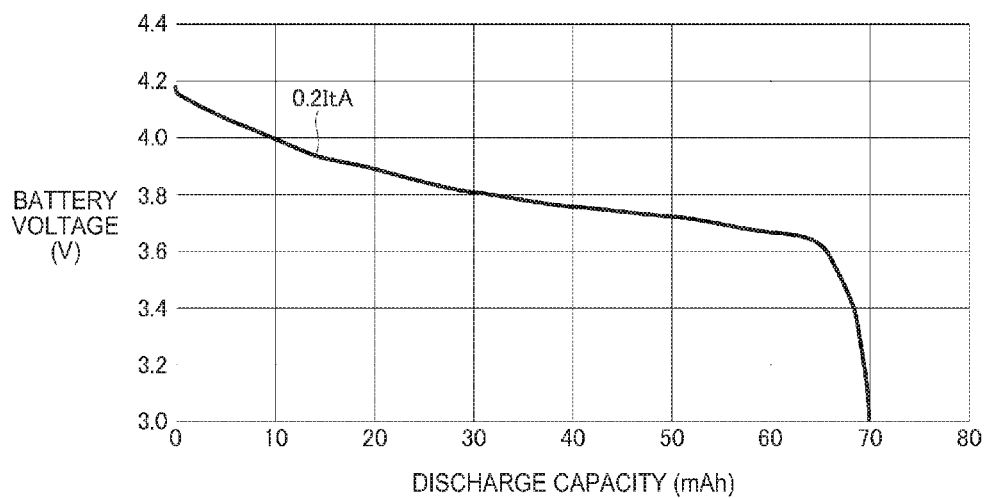
FIG. 8 is a graph of the relationship between the discharge capacity and the battery voltage of the storage battery.

The relationship between the battery voltage and the reserve power is shown in FIG. 8. In this embodiment the storage battery 24 is a lithium ion battery, and FIG. 8 shows the voltage discharge characteristic of the battery. As will be understood from the relationship between the battery voltage and the discharge capacity (reserve power) shown in FIG. 8, the reserve power of the storage battery 24 can be known by measuring the battery voltage of the storage battery 24.

The voltage detection circuit 74 is operated as controlled by the voltage detection controller 630 at a specific interval, such as every 60 seconds. Because the voltage detection circuit 74 thus detects the battery voltage every 60 seconds, the controller 61 always knows the reserve power in the storage battery 24.

The voltage detection controller 630 of the controller 61 sets a first threshold at which the reserve power of the storage battery 24 is sufficient to execute the positioning reception process, which consumes more current than the timekeeping reception process, without the controller 61 shutting down, and a second threshold at which the timekeeping reception process can be run without the controller 61 shutting down. For a storage battery 24 with the discharge characteristic shown in FIG. 8, the second threshold is set to 3.6 V, and the first threshold is set to 3.8 V. In the graph in FIG. 8, the discharge capacity is approximately 50% of the maximum capacity when the battery voltage is 3.8 V, and is approximately 90% of the maximum capacity when the battery voltage is 3.6 V. The voltages used for the first threshold and the second threshold can thus be set desirably according to the discharge characteristic of the storage battery 24.

Note that the remaining storage battery 24 capacity (reserve power) is detected in this embodiment by detecting the battery voltage of the storage battery 24. Alternatively, detection accuracy may be improved by detecting the discharge current of the storage battery 24 and using the discharge current in combination with the battery voltage.

The display controller 620 then moves the hand 4 to indicate the reserve power based on the battery voltage detected by the voltage detection circuit 74. The F marker shown in FIG. 2 indicates the reserve power in the battery (discharge capacity) is great, and the E marker indicates the reserve power in the battery (discharge capacity) is low. When the hand 4 points to the black area near the F marker on the reserve power scale, the remaining battery capacity is high and the user can know that battery capacity is sufficient to execute the positioning reception process. The hand 4 and subdial 2A thus are an example of a reserve power display that indicates the remaining battery capacity.

After adjusting the display in S2, the controller 61 determines if the button 7 was pushed for the first set time or more (S3).

This first set time is set to enable determining if the user intentionally performed the timekeeping reception operation, and in this example is 3 seconds. If the user releases the button 7 in less than 3 seconds after pushing the button 7, the controller 61 determines that the button 7 was pushed for less than the first set time and returns NO in S3. In this event, the controller 61 does not operate the reception controller 640, does not start the reception process, and resumes normal movement of the hands (S4).

However, if the user presses the button 7 continuously for the first set time, the controller 61 returns YES in S3. The controller 61 then determines if the reserve power (remaining battery capacity) detected by the voltage detection circuit 74 is greater than or equal to the second threshold (3.6 V in this example) (S5).

If the remaining battery capacity is less than the second threshold and S5 returns NO, the controller 61 does not start the reception process, and resumes normal movement of the hands (S4).

The second threshold is set to a level at which there is no chance of the storage battery 24 voltage dropping and the controller 61 shutting down even if the timekeeping reception process is run. Therefore, while there is a chance of the controller 61 shutting down if the timekeeping reception process starts when the remaining battery capacity is less than the second threshold, the controller 61 shutting down is prevented in this embodiment because the reception process does not start if the remaining battery capacity is less than the second threshold.

If the remaining battery capacity is greater than or equal to the second threshold (3.6 V in this example) and S5 returns YES, the controller 61 operates the timekeeping reception controller 641 and starts the timekeeping reception process (S6).

When the timekeeping reception controller 641 starts the timekeeping reception process, the display controller 620 indicates with the second hand 31 that the timekeeping reception process is running (S7). More specifically, the display controller 620 holds the second hand 31 at the 1 marker disposed to the 38-second position on the dial 2 during the timekeeping reception process. The second hand 31 and dial 2 thus are an example of a reception state display that indicates when the timekeeping reception process is running.

In the timekeeping reception process, at least one GPS satellite S is locked, satellite signals are received therefrom, and the Z count (time information) that is transmitted every 6 seconds from the GPS satellites S is acquired.

The controller 61 then determines if the button 7 remained depressed for the second set time or longer (S8).

This second set time is set to enable determining if the user intentionally performed the positioning reception operation, and in this example is 6 seconds. If the user releases the button 7 in more than 3 seconds and less than 6 seconds after pushing the button 7, the controller 61 determines that the button 7 was pushed for less than the second set time and returns NO in S8. In this event, the controller 61 executes the timekeeping reception continuation process of the timekeeping reception controller 641 (S20).

However, if the user holds the button 7 depressed for the second set time (6 seconds in this example) or longer, the controller 61 returns YES in S8. The controller 61 then determines if the reserve power (remaining battery capacity) detected by the voltage detection circuit 74 is greater than or equal to the first threshold (3.8 V in this example) (S9).

If the remaining battery capacity is less than the first threshold and S9 returns NO, the controller 61 executes the timekeeping reception continuation process (S20).

The first threshold is set to a level at which there is no chance of the storage battery 24 voltage dropping and the controller 61 shutting down even if the positioning reception process is run. Therefore, while there is a chance of the controller 61 shutting down if the positioning reception process starts when the remaining battery capacity is less than the first threshold, the controller 61 shutting down is prevented in this embodiment because the timekeeping reception process continues and the positioning reception process does not start if the remaining battery capacity is less than the first threshold.

If the remaining battery capacity is greater than or equal to the first threshold and S9 returns YES, the controller 61 operates the timekeeping reception controller 641 and starts the positioning reception process (S30).

Timekeeping Reception Continuation Process

Figure 9:
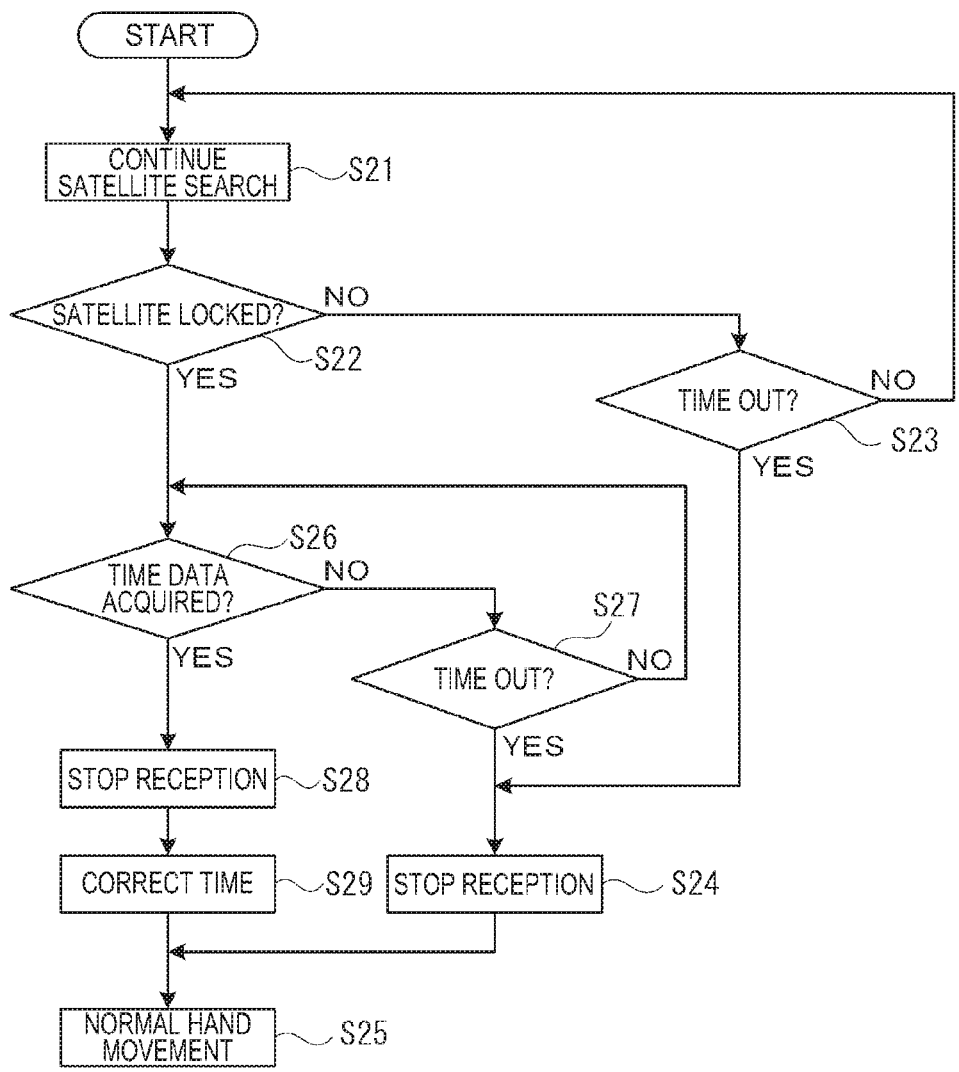
FIG. 9 is a flow chart of the timekeeping reception continuation process in the manual reception process of an embodiment.

The process of continuing the timekeeping reception process (S20) shown in FIG. 9 is described next. The process shown in FIG. 9 starts in this embodiment when the timekeeping reception process has started in S6 and the timekeeping reception process is indicated by the second hand 31 in S7.

The timekeeping reception controller 641 continues the satellite search started in S6 (S21). Next, the timekeeping reception controller 641 determines if a satellite can be locked onto (S22). If S22 returns NO because a satellite cannot be locked, the timekeeping reception controller 641 determines if the time past since timekeeping reception started in S6 has reached a specific timeout time (such as one to two minutes) (S23).

If the timeout period has passed and reception times out in S23 (S23 returns YES), the timekeeping reception controller 641 stops reception and the controller 61 resumes normal movement of the hands (S25).

However, if operation has not timed out in S23 (S23 returns NO), the timekeeping reception controller 641 continues the satellite search process in S21.

If the timekeeping reception controller 641 determines a satellite was locked in S22 (S22 returns YES), it determines if the time data (Z count) was acquired (S26). If plural satellites have been locked, time data may be acquired from satellite data with a high signal strength (SNR), time data may be acquired from plural satellites, or whether the time data matches can be checked to determine if time data acquisition was successful.

If S26 returns NO, the timekeeping reception controller 641 determines if a specific timeout period (such as 30 seconds) has past (S27).

If S27 returns NO, the timekeeping reception controller 641 repeats S26. Because the Z count is transmitted every 6 seconds in GPS satellite signals, if the timeout period in S27 is 30 seconds, the Z count can be received five times before reception times out.

If in S27 operation times out (S27 returns YES), the timekeeping reception controller 641 ends the reception process, and resumes normal movement of the hands (S25).

However, if S26 returns YES, the timekeeping reception controller 641 ends reception (S28), and the time information corrector 610 corrects the time information based on the acquired time data (S29). When the time information corrector 610 corrects the time information, the display controller 620 corrects the time displayed by the hands 3 through the drive circuit 62 based on the corrected time information, and then resumes normal movement of the hands (S25).

The process performed when the timekeeping reception operation is performed thus ends.

Positioning Reception Process

Figure 7:
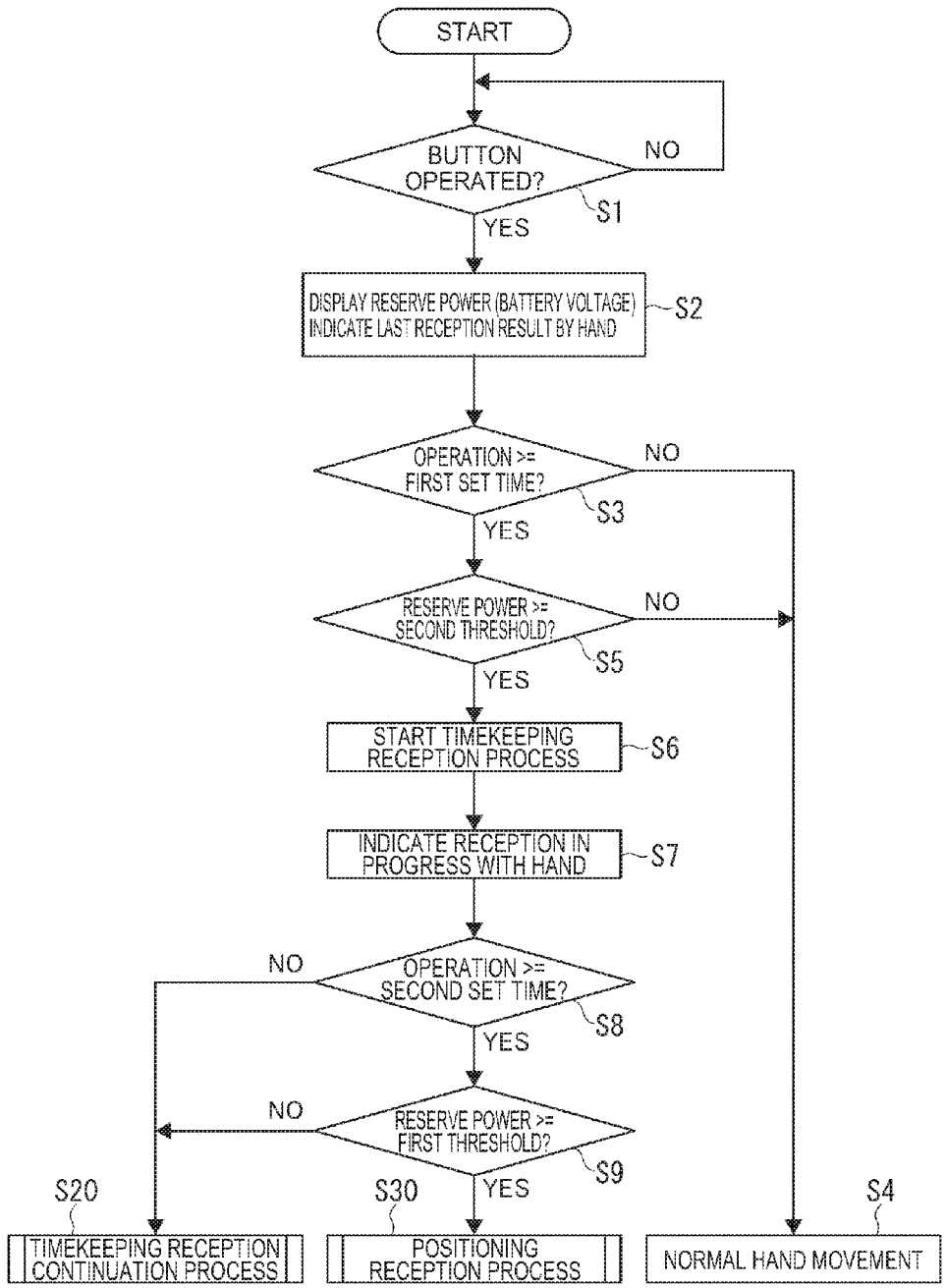
FIG. 7 is a flow chart of the manual reception process in an embodiment.
Figure 10:
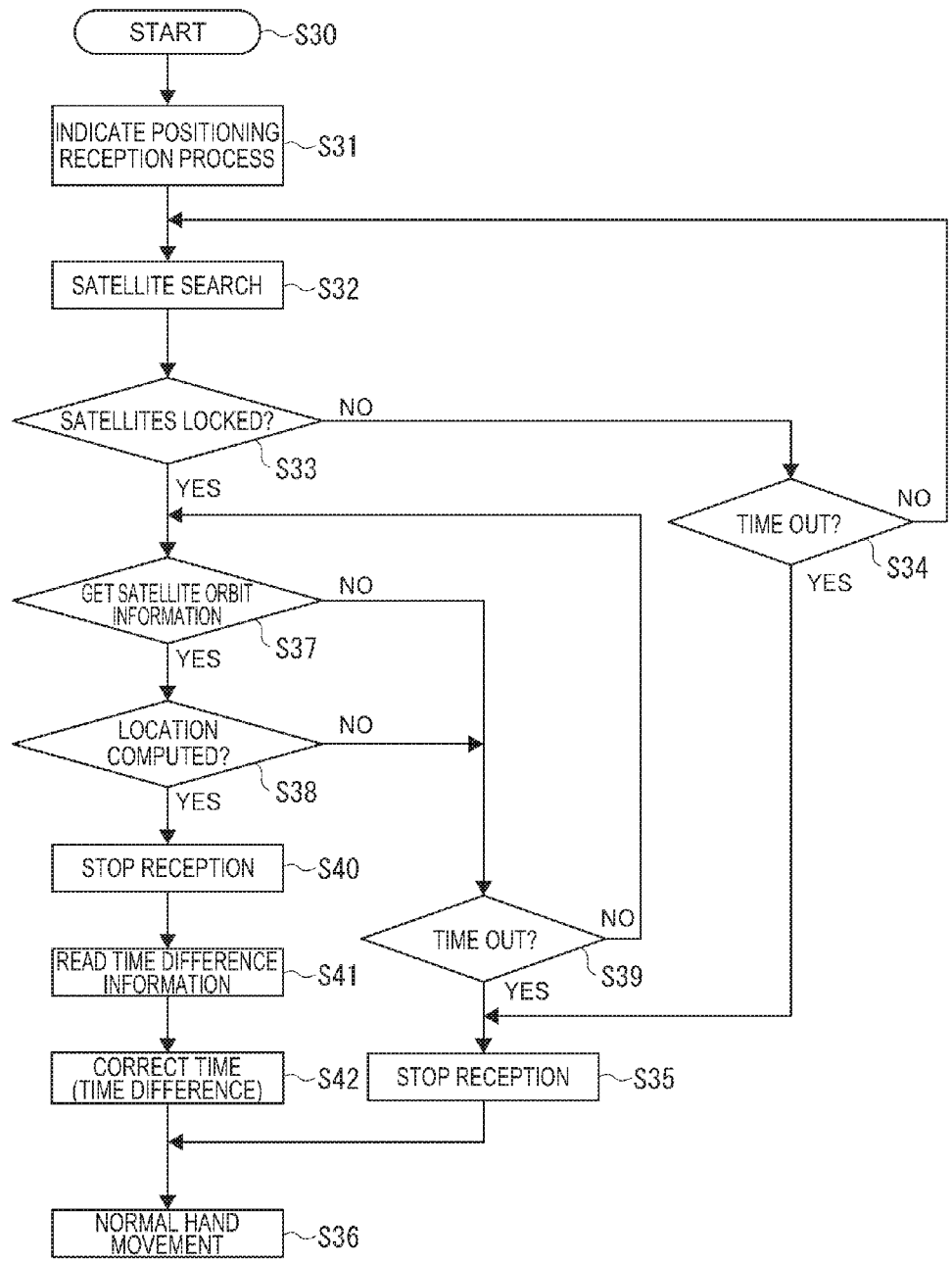
FIG. 10 is a flow chart of the positioning reception process in the manual reception process of an embodiment.

The positioning reception process in step S30 in FIG. 7 is described next with reference to FIG. 10.

When the positioning reception process in step S30 starts, the display controller 620 indicates with the second hand 31 that the positioning reception process is running (S31). More specifically, during the positioning reception process, the display controller 620 holds the second hand 31 at the 4+ marker at the 52-second position on the dial 2. The second hand 31 and dial 2 thus are an example of a reception state display that indicates when the positioning reception process is running. The positioning reception controller 642 also outputs a control signal to the reception module 50 to start the positioning reception process (S31).

When starting the positioning reception process is commanded, the reception module 50 (baseband circuit 52) starts the satellite search (S32).

If the satellite signal reception level in the satellite search is at least a specific previously set level, the reception module 50 determines that GPS satellite S can be locked.

The reception module 50 then determines if satellite signals can be received from at least the specific number of satellites required for positioning (at least 3, and usually four) (S33).

If S33 returns NO, the reception module 50 determines if the timeout period for the satellite search process has past (S34). This satellite search process timeout period is 15 seconds, for example.

If S34 returns NO, the reception module 50 continues the satellite search in S32.

If S34 returns YES, the reception module 50 ends the positioning reception process (S35), and the controller 61 resumes normal movement of the hands (S36). This is to avoid continuing the reception process and wasting battery 24 power because the electronic timepiece 1 is in a location where GPS satellites S cannot be locked.

If S33 returns YES, the reception module 50 determines if satellite orbit data (ephemeris) was successfully acquired from the locked satellite signals (S37).

If S37 returns YES, the reception module 50 computes the location based on the acquired satellite orbit information, and then determines if computing the location is completed (S38).

If S37 or S38 returns NO, the reception module 50 determines if the timeout period for calculating the location has past (S39). This timeout period for calculating the location is 120 seconds, for example.

If the reception module 50 determines operation timed out in S39 (S39 returns YES), it ends the reception process (S35), and the controller 61 then resumes normal movement of the hands (S36).

If operation has not timed out in S39 (S39 returns NO), the reception module 50 returns to S37 and continues the process.

If S38 returns YES, the reception module 50 ends the reception process (S40), reads the time difference information corresponding to the location data obtained by the location calculation from the time difference (time zone) database stored in flash memory 54, and outputs to the controller 61 (S41).

The time information corrector 610 of the controller 61 then corrects the time information using the time difference information output from the reception module 50, and the display controller 620 moves the hands 3 to display the corrected time (S42). Next, the controller 61 resumes normal movement of the hands (S36).

Operating Effect of the Embodiment

When the user performs a positioning reception operation, the positioning reception controller 642 executes the positioning reception process if the remaining battery capacity detected by the voltage detection circuit 74 is greater than or equal to a first threshold, but does not execute the positioning reception process if the remaining battery capacity is less than the first threshold. The electronic timepiece 1 can therefore be reliably prevented from shutting down when the positioning reception process runs.

More specifically, because the positioning reception process must lock onto at least four GPS satellites S to compute the location, the reception time is a maximum 120 seconds (average 80 seconds), and a large amount of energy is consumed. Therefore by limiting execution of the positioning reception process to when the remaining battery capacity (reserve power) is greater than or equal to a first threshold, a system shutdown resulting from the battery power dropping below the minimum required operating voltage of the controller 61 can be prevented.

Furthermore, because the reserve power is indicated by the subdial hand 4 when the positioning reception operation is performed, the reserve power in the storage battery 24 can be displayed for the user, the user can know that the positioning reception process did not execute because the reserve power is too low if the positioning reception process does not execute, and the user will not wonder why the positioning reception process is not run.

When the timekeeping reception operation is performed, the timekeeping reception controller 641 executes the timekeeping reception process if the remaining battery capacity is less than the first threshold but greater than the second threshold, and can therefore increase opportunities to acquire time information. The accuracy of the time displayed by the electronic timepiece 1 can therefore be improved.

More specifically, the timekeeping reception process requires locking only one GPS satellite S and reception takes a short ten-plus seconds, and energy consumption is low at approximately ⅕ the energy consumption in the positioning reception process. A system shutdown resulting from the battery power dropping below the minimum required operating voltage of the controller 61 can therefore be prevented even if the timekeeping reception process is executed when the remaining battery capacity (reserve power) is less than the first threshold.

Furthermore, because the timekeeping reception process is limited to when the remaining battery capacity (reserve power) is greater than or equal to a second threshold, a system shutdown resulting from the battery power dropping below the minimum required operating voltage of the controller 61 can be reliably prevented.

Furthermore, the timekeeping reception controller 641 also indicates the remaining battery capacity when starting the timekeeping reception process, the user can know that the timekeeping reception process did not execute because the reserve power is too low if the timekeeping.

Furthermore, because the display controller 620 indicates that the positioning reception process is executing, or the timekeeping reception process is executing, with the second hand 31, the user can easily know if the executing reception process is in the positioning mode or the timekeeping mode.

Because the power supply 70 includes a solar panel 25 and storage battery 24, the user can intentionally expose the solar panel 25 to light to recharge the storage battery 24 when, for example, the remaining battery capacity goes below the first threshold or the second threshold and the reception process cannot execute. The reception process can then be executed if the remaining battery capacity is greater than the first threshold or the second threshold the next time a reception operation is performed.

Because the timekeeping reception process starts when YES is returned in step S3 or S5 even if the timekeeping reception process is not confirmed, the timekeeping reception process can be started more quickly than if the timekeeping reception process is started after the timekeeping reception operation is confirmed, and the total time from when the user starts the operation to when satellite signals are received and time information is acquired can be shortened. As a result, the timekeeping reception process that is performed more frequently than the positioning reception process can be performed in even less time.

Other Embodiments

The invention is not limited to the embodiments described above, and can be modified and improved in many ways without departing from the scope of the accompanying claims.

Figure 11:
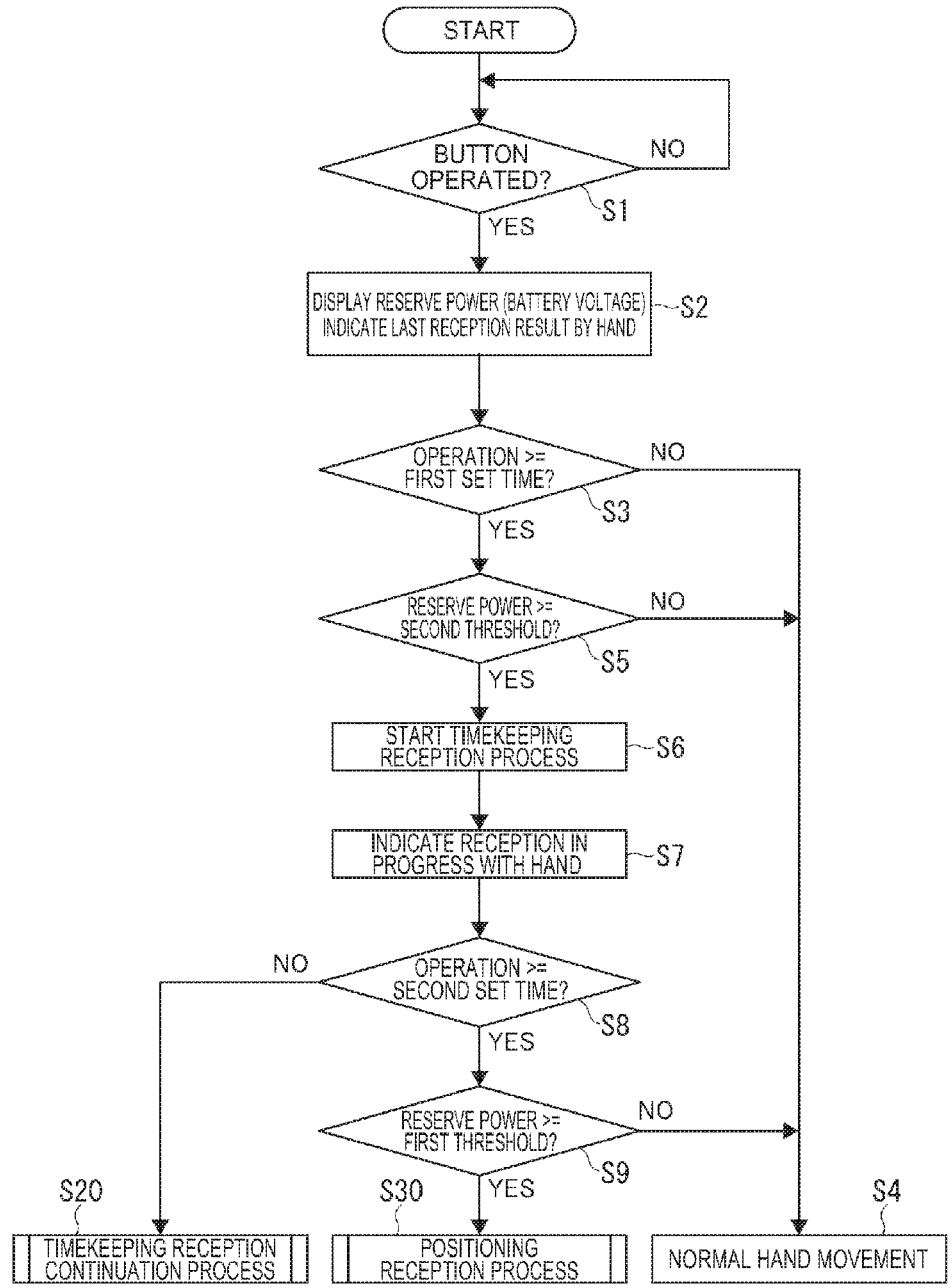
FIG. 11 is a flow chart of the manual reception process in another embodiment.

For example, the timekeeping reception continuation process S20 executes in the foregoing embodiment if NO is returned in step S9 in FIG. 7 because the storage battery 24 voltage is less than the first threshold (3.8 V) and the positioning reception process cannot execute. However, as shown in FIG. 11, when NO is returned in S9, the reception process may be skipped and normal movement of the hands resumed in S4. In this event, because the timekeeping reception process started in S6 is aborted if the battery voltage is less than the first threshold, the voltage drop of the storage battery 24 is suppressed, and the time until charging with the solar panel 25 can restore the voltage of the storage battery 24 to the first threshold or above and the positioning reception process can be executed can be shortened.

Furthermore, the timekeeping reception process starts before the timekeeping reception operation is confirmed in the foregoing embodiment, but the timekeeping reception process may be started after the timekeeping reception operation is confirmed. More specifically, More specifically, when the button 7 is pushed, the voltage of the storage battery 24 is indicated by the hand 4, and the second hand 31 indicates the result of the last reception process. If the depressed button 7 is released in less than 3 seconds, normal movement of the hands resumes. If the pushed button 7 is released between 3 seconds and 6 seconds, the voltage of the storage battery 24 is determined to equal or exceed the second threshold, and the timekeeping reception process starts if the battery voltage is the second threshold or above. If the pushed button 7 is held depressed for 6 seconds or more, the voltage of the storage battery 24 is determined to be the first threshold or above, and the positioning reception process executes if the battery voltage is the first threshold or above.

However, if the voltage of the storage battery 24 is less than the threshold, the same processes shown in FIG. 7 and FIG. 11 may execute.

Because the reception process executes after confirming the reception operation performed by the user, power consumption can be reduced compared with aborting the timekeeping reception process and running the positioning reception process. More specifically, the process of the foregoing embodiment may be executed if speed and shortening the time until the timekeeping reception process ends are important, and a process such as described here may be executed is suppressing power consumption and saving energy are more important.

The hand 4 in the foregoing embodiment normally indicates the day of the week, and indicates the voltage (reserve power) of the storage battery 24 when the button 7 is pushed, but a hand that normally indicates the reserve power of the storage battery 24 may be separately provided. In this event, the user can be easily informed when the storage battery 24 voltage drops, and the user can be prompted to recharge the storage battery 24 with the solar panel 25.

Furthermore, the voltage of the storage battery 24 may be indicated only when the positioning reception operation is performed, and not when the timekeeping reception operation is performed. This is because being unable to execute the reception process when the voltage of the storage battery 24 drops occurs more frequently when the positioning reception process is selected.

In the embodiment described above, the timekeeping reception process executes when the timekeeping reception operation is performed and the storage battery 24 voltage is greater than or equal to the second threshold, and the timekeeping reception process does not execute when the battery voltage is less than the second threshold. Alternatively, the decision step of S5 in FIG. 7 may be skipped, and the timekeeping reception process executed when the timekeeping reception operation is performed. More specifically, a configuration that executes the timekeeping reception process when the timekeeping reception operation is performed regardless of whether the voltage of the storage battery 24 is less than the first threshold at which the positioning reception process does not execute, or is greater than or equal to the first threshold, is also conceivable.

The voltage detection controller 630 in the foregoing embodiment operates the voltage detection circuit 74 to detect the voltage at a regular interval, but a configuration in which the voltage detection controller 630 operates the voltage detection circuit 74 to detect the battery voltage whenever the button 7 is pushed and the manual reception process is started (when YES is returned in S1 of button 7 or FIG. 11) is also conceivable. If the voltage is detected when a button for manual reception is operated, the voltage of the storage battery 24 will be measured immediately before the reception process executes, and the battery capacity remaining when the reception process starts can be determined more accurately. As a result, the reception controller 640 can appropriately select the reception mode and select whether or not to execute the reception process based on the voltage of the storage battery 24 detected immediately before.

The electronic timepiece according to the above embodiments and variations has a time display comprising a dial 2 and hands 3, but the invention is not so limited. The electronic timepiece may have a time display comprising a LCD panel, for example. In this event, the drive module for driving the time display includes a driver for driving the LCD panel.

In this case, the electronic timepiece simply requires a time display function, and the time display need not be a display for displaying only the time. Examples of such electronic timepieces are wrist-wearable devices such as heart rate monitors that are worn on the user's wrist to measure the heart rate, and GPS loggers that are worn on the wrist and measure the user's current location while the user is jogging.

The foregoing embodiments are described with reference to a GPS satellite as an example of a positioning information satellite, but the positioning information satellite of the invention is not limited to GPS satellites and the invention can be used with Global Navigation Satellite Systems (GNSS) such as Galileo (EU), GLONASS (Russia), and Beidou (China). The invention can also be used with geostationary satellites in satellite-based augmentation systems (SBAS), and quasi-zenith satellites in radio navigation satellite systems (RNSS) that can only search in specific regions. The invention can also be used in configurations that receive and process satellite signals from multiple systems.

The invention being thus described, it will be obvious that it may be varied in many ways. Such variations are not to be regarded as a departure from the spirit and scope of the invention, and all such modifications as would be obvious to one skilled in the art are intended to be included within the scope of the following claims.

This application claims priority under 35 U.S.C. §119 on Japanese Patent Application No. 2015-45222, filed Mar. 6, 2015, which is expressly incorporated by reference herein.

What is claimed is:

1. An electronic timepiece comprising:
   a receiver configured to receive satellite signals containing time information from positioning information satellites;
   a power supply including a battery to supply drive power;
   a remaining battery capacity detector configured to detect the remaining battery capacity of the power supply;
   an interface member;
   a timekeeping reception controller configured to execute a timekeeping reception process in response to a timekeeping reception operation of the interface member; and
   a positioning reception controller configured to execute a positioning reception process in response to a positioning reception operation of the interface member;
      the positioning reception controller executing the positioning reception process if the remaining battery capacity detected by the remaining battery capacity detector is greater than or equal to a first threshold, and
         not executing the positioning reception process if the remaining battery capacity is less than the first threshold; and
      the timekeeping reception controller executing the timekeeping reception process if the remaining battery capacity detected by the remaining battery capacity detector is greater than or equal to the first threshold and if the remaining battery capacity is less than the first threshold.

2. The electronic timepiece described in claim 1, wherein:
   the timekeeping reception controller executes the timekeeping reception process if the remaining battery capacity detected by the remaining battery capacity detector is greater than or equal to a second threshold that is lower than the first threshold, and
      does not execute the timekeeping reception process if the remaining battery capacity is less than the second threshold.

3. The electronic timepiece described in claim 1, further comprising:
   a remaining battery capacity display configured to display the remaining battery capacity detected by the remaining battery capacity detector at least if the positioning reception controller starts the positioning reception process.

4. The electronic timepiece described in claim 1, further comprising:
   a reception state display configured to indicate the positioning reception process if the positioning reception process is executing, and
      indicate the timekeeping reception process if the timekeeping reception process is executing.

5. The electronic timepiece described in claim 1, wherein:
   the power supply includes a power generator and a storage battery that is charged by power produced by the power generator.

6. The electronic timepiece described in claim 1, wherein:
   the timekeeping reception controller starts the timekeeping reception process if the interface member is operated continuously for a first set time;
   the timekeeping reception controller continues the timekeeping reception process if operation of the interface member is released before a second set time that is longer than the first set time passes; and
   operation switches from the timekeeping reception process of the timekeeping reception controller to the positioning reception process of the positioning reception controller if the interface member is operated continuously for the second set time.

7. A control method of an electronic timepiece including a receiver configured to receive satellite signals containing time information from positioning information satellites;
   a power supply including a battery to supply drive power;
   a remaining battery capacity detector configured to detect the remaining battery capacity of the power supply;
   an interface member;
   a timekeeping reception controller configured to execute a timekeeping reception process in response to a timekeeping reception operation of the interface member; and
   a positioning reception controller configured to execute a positioning reception process in response to a positioning reception operation of the interface member;
   the control method comprising:
   the positioning reception controller executing the positioning reception process if the remaining battery capacity detected by the remaining battery capacity detector is greater than or equal to a first threshold, and
      not executing the positioning reception process if the remaining battery capacity is less than the first threshold; and
   the timekeeping reception controller executing the timekeeping reception process if the remaining battery capacity detected by the remaining battery capacity detector is greater than or equal to the first threshold and if the remaining battery capacity is less than the first threshold.

* * * * *